United States Patent [19]

Bhattacharya et al.

[11] Patent Number: 4,636,737
[45] Date of Patent: Jan. 13, 1987

[54] FREQUENCY MODULATOR AND DEMODULATOR USING MATERIAL HAVING SLIDING CHARGE DENSITY WAVES

[75] Inventors: Sabyasachi Bhattacharya, Somerville; Aaron N. Bloch, Bridgewater; James P. Stokes, Flemington, all of N.J.

[73] Assignee: Exxon Research and Engineering Company, Florham Park, N.J.

[21] Appl. No.: 752,521

[22] Filed: Jul. 8, 1985

Related U.S. Application Data

[63] Continuation-in-part of Ser. No. 634,823, Jul. 26, 1984, Pat. No. 4,580,110.

[51] Int. Cl.[4] .............................................. H03D 3/00
[52] U.S. Cl. .................................... 329/110; 329/119; 331/107 R; 332/16 R; 357/1; 455/214
[58] Field of Search ............. 332/16 R; 329/110, 119; 455/110, 42, 44, 113, 214, 337; 331/107 R; 357/1, 2, 3

[56] References Cited

U.S. PATENT DOCUMENTS 3,818,377  6/1974  Yamashita et al. ................ 332/16 R Primary Examiner—Siegfried H. Grimm
Attorney, Agent, or Firm—Ronald D. Hantman

[57] ABSTRACT

The present invention is a method and a device for the frequency modulation and/or demodulation of a signal applied to materials that carry sliding charge density waves. A particular example of such a material is orthorhombic $TaS_3$ that acts as a frequency modulator.

5 Claims, 4 Drawing Figures

FREQUENCY MODULATOR AND DEMODULATOR USING MATERIAL HAVING SLIDING CHARGE DENSITY WAVES

CROSS REFERENCE TO RELATED APPLICATIONS

This application is a continuation-in-part of U.S. Ser. No. 634,823, filed July 26, 1984 and now U.S. Pat. No. 4,580,110.

BACKGROUND OF THE INVENTION

The present invention relates to frequency modulation. In particular, the present invention relates to frequency modulation using materials that carry a sliding charge density wave.

A. Modulation

The fundamental purpose of modulation is to superimpose the desired intelligence signals on a high-frequency carrier for transmission at that high frequency from one point to another.

A signal is transmitted from one point to another for a variety of purposes. The most common example is communications between geographic areas. For a communications (e.g., telephone) circuit between two points the physical equipment usually involves an enormous quantity of hardware (e.g., poles, cross-arms, insulators, and wires). When the demand on the circuit becomes large, it is necessary to add additional facilities.

One method of increasing the facility of a circuit is to use a method of modulation. For example, a voice-frequency band from 200 to 3000 cycles is required for telephone communications. If we take bands of frequencies, 0 to 3 kc, 3 to 6 kc, 6 to 9 kc, 9 to 12 kc, and 12 to 15 kc a total band of 0 to 15 kc apparently could provide five separate channels for five separate telephone circuits over one pair of wires, provided that the original band of 200 to 3000 cycles can be transferred to each of the high-frequency bands. The process of superimposing the information contained within a frequency band onto another frequency band is called modulation. The process of decoding or converting the signal back to its original form is called demodulation or detection.

The energy medium by which the signal is to be transferred is called the carrier. The signal is often termed the modulating frequency. If we consider a single-frequency carrier, $\omega_o$, we may write $$e_o = E_m \cos(\omega_o t + \theta)$$

When the amplitude of the carrier $E_m$ is varied in accordance with the signal information, we have amplitude modulation (AM). When the frequency of the carrier $\omega_o$ is varied in accordance with the signal, we have frequency modulation (FM). When the phase angle $\theta$ is varied in accordance with the signal, we have phase modulation.

Frequency modulation is superior to amplitude modulation for reducing the static and noise present in home reception of the standard AM broadcasts. Since most natural and manmade electrical noise is in the form of amplitude-modulated signals, a method of keeping the amplitude $E_m$ constant while incorporating the signal into variations of the carrier frequency $\omega_o$ accomplishes the desired noise reduction.

The frequency $\omega_o$ is modified by the signal amplitude and signal frequency. The deviation frequency, $\omega_f$ from $\omega_o$ contains the information on the amplitude or volume of the signal. The frequency of the signal, $\omega_m$, is the rate of change of the output frequency.

These two concepts are correlated by the index of modulation, $m_f$, as $$m_f = \omega_f / \omega_m$$

The FM output wave can be written as an infinite series of terms (carrier plus sidebands) containing Bessel functions which depend on $m_f$ and $\omega_m$.

B. Charge Density Waves (CDW)

In most metals and semiconductors, Ohm's law and the frequency ($\omega$)-independent conductivity $\sigma$ are the well-established and well-understood consequences of the band theory of solids. Deviations from Ohmic behavior and frequency dependent response is observed only at large electrical fields E or at relatively high (optical) frequencies, where the energy provided by the dc or ac fields is comparable with the single particle energies.

In contrast to this situation, charge transport is usually field and frequency-dependent at moderate fields and frequencies in materials where the electron structure, and consequently the conduction process, is highly anisotropic.

Low dimensional conductors or linear chain conductors are materials which have a chain structure: the solid is built of chains of atoms or molecules with strongly overlapping electronic wave functions along the chain direction, while the coupling or overlap of the wave functions between the chains is weak. This chain structure leads therefore to highly anisotropic electronic band structures.

Drastic deviations from single particle transport (due to extended electron states) are expected in linear chain compounds. In addition to the modification of the single particle dispersion relation, collective modes appear where a periodic modulation of the charge density occurs.

These collective modes appear in certain low-dimensional or linear chain conductors like $TaS_3$ or $NbSe_3$ which undergo a phase transition at low temperatures to a state where the electrons condense into a spatially periodic arrangement, known as the Charge-Density-Wave state (CDW). The temperature below which the system is in the charge density wave state varies from one material to another. For example, this temperature is 220° K. for orthorhombic $TaS_3$.

In these systems the CDW is pinned by the impurities present in the sample in the absence of a driving electric field. When a d.c. electric field above a certain threshold value is applied to the sample, the CDW is depinned and is able to slide through the sample, thereby providing a new mechanism of charge transport.

The sliding CDW is associated with the onset of a non-linear current-voltage characteristics and the appearance of an a.c. component in the current. The fundamental component of the a.c. current is found to be proportional to the excess current that is carried by the CDW. This a.c. component is known as the narrow-band-noise or the coherent current oscillations. The frequency spectrum of this a.c. component consists of well-defined peaks at the fundamental and its higher harmonics.

In the present invention, these characteristics of the sliding of the CDW are utilized in a method and system for the frequency modulation of a carrier frequency by a signal frequency.

SUMMARY OF THE INVENTION

Figure 1:
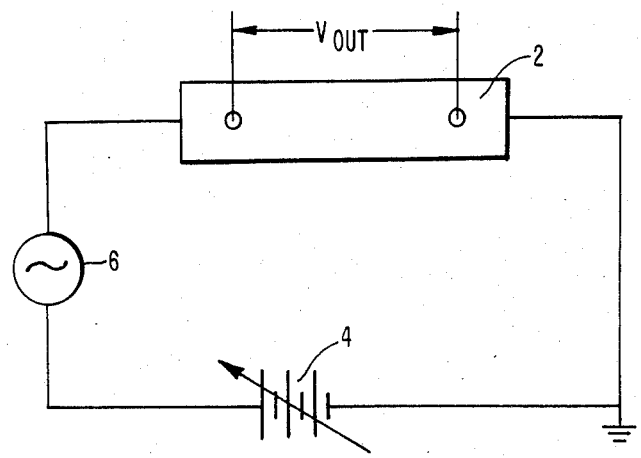
FIG. 1 shows a schematic diagram of the system according to the present invention.

The present invention is a system and method for frequency modulation or frequency demodulation of a signal. For frequency modulation, a carrier-frequency, which is tunable, is generated. A modulation frequency then modulates the carrier. The system for the modulation of the carrier depends on the effect of a.c. - d.c. mixing in the sliding CDW which is caused by driving the system with an amplitude-modulated field. This field generates frequency modulated coherent current oscillations.

The frequency spectrum of the current of the preferred embodiment, orthorhombic TaS$_3$, develops sidebands at frequencies $\omega_o \pm n\omega_M$ where $\omega_o$ is the material fundamental of the current oscillation in the absence of the a.c. modulation. Varying the amplitude of the modulation results in the variation of the amplitude of the side-bands and the carrier frequency. This variation is found to be in excellent agreement with the results obtained theoretically for the general case of frequency modulation (FM) with no adjustable parameters.

Thus, the sliding CDW system acts as a single crystal frequency modulator. A decided advantage of the CDW system, however, lies in the tunability of the carrier-frequency (1 kHz–1 GHz).

The steps of the method of the present invention as applied to modulation are:

(a) imposing a direct current voltage across a material which displays sliding of a charge density wave such that the voltage induces a current in the material having direct current and alternating current components wherein the alternating current has a frequency, $\omega_o$, which depends on the direct current component;

(b) applying a signal voltage having an amplitude and a signal frequency, $\omega_M$, across the material in series with the direct current voltage; and, (c) obtaining a frequency modulated signal from the material wherein the frequency, $\omega_o$, is the carrier frequency for the modulated signal, the carrier frequency being frequency modulated in a predetermined way that depends on the signal voltage amplitude and frequency.

For frequency demodulation, the system is the same as that for frequency modulation. However, the steps of the method of the present invention as applied to demodulation are:

(a) imposing a direct current voltage across a material which displays sliding of a charge density wave such that the voltage induces a current in the material having direct current and alternating current components wherein the alternating current has a frequency, $\omega_o$, which depends on the direct current component, the frequency, $\omega_o$, being the same as the carrier frequency of the signal to be demodulated;

(b) applying the signal voltage to be demodulated across the material in series with the direct current voltage; and, (c) obtaining a frequency demodulated signal from the material.

DESCRIPTION OF THE PREFERRED EMBODIMENT

As discussed above, many metallic layer and chain compounds show phase transitions associated with the development of charge density waves (CDW) below a particular temperature, $T_p$.

Materials that exhibit this characteristic include:

| COMPOUND | $T_p$ (K) |
|---|---|
| NbSe$_3$ | 142 |
| TaS$_3$ | 215 |
| NbS$_3$ | 155 |
| K$_{0.3}$MoO$_3$ | 183 |
| (TaSe$_4$)$_2$I | 265 |
| (NbSe$_4$)$_{10}$I$_3$ | 285 |

The sliding charge density wave (CDW) conductors display intriguing electrical transport properties such as the non-linear conductivity and the coherent current oscillations—the so-called narrow-band-noise when a d.c. electric field above a certain threshold value is applied to the sample. The frequency of the oscillations is found to scale linearly with the non-linear part of the d.c. current.

The linear relationship between the d.c. CDW current and the frequency of the periodic voltage implies:

$$\omega_o = \alpha I_{CDW} \quad (1)$$

where $\omega_o$ is the frequency, $\alpha$ is a system parameter and $I_{CDW}$ is the nonlinear part of the current. Now if $I_{CDW}$ contains an a.c. component, $\omega_o$ will also vary in time. In particular, by superimposing an a.c. voltage of frequency $\omega_M$ upon the d.c. we obtain a signal developed across the sample that is periodic, given by $$E(t) = \sum_{n=-\infty}^{n=\infty} J_n\left(\frac{\omega_F}{\omega_M}\right) e^{i(\omega_o + n\omega_M)t} \quad (2)$$

where $J_n(\omega_F/\omega_M)$ is the nth order Bessel function. The voltage as a function of frequency is:

$$E(\omega) = \sum_{n=-\infty}^{n=\infty} J_n\left(\frac{\omega_F}{\omega_M}\right) [-i(\omega_o + n\omega_M t)] \quad (3)$$

Eq. 3 is the standard expression for frequency modulation. A comparison with experimental results measures the quality of the performance of the device.

EXAMPLE

A single crystal of orthorhombic TaS$_3$, 2, was mounted in a configuration shows schematically in FIG. 1 and maintained at 130 K where it is in its CDW state. A d.c. voltage in excess of the threshold field was established. With only the dc of 60 mV across the sample the characteristic a.c. signal appeared at 830 KHz.

Figure 2:
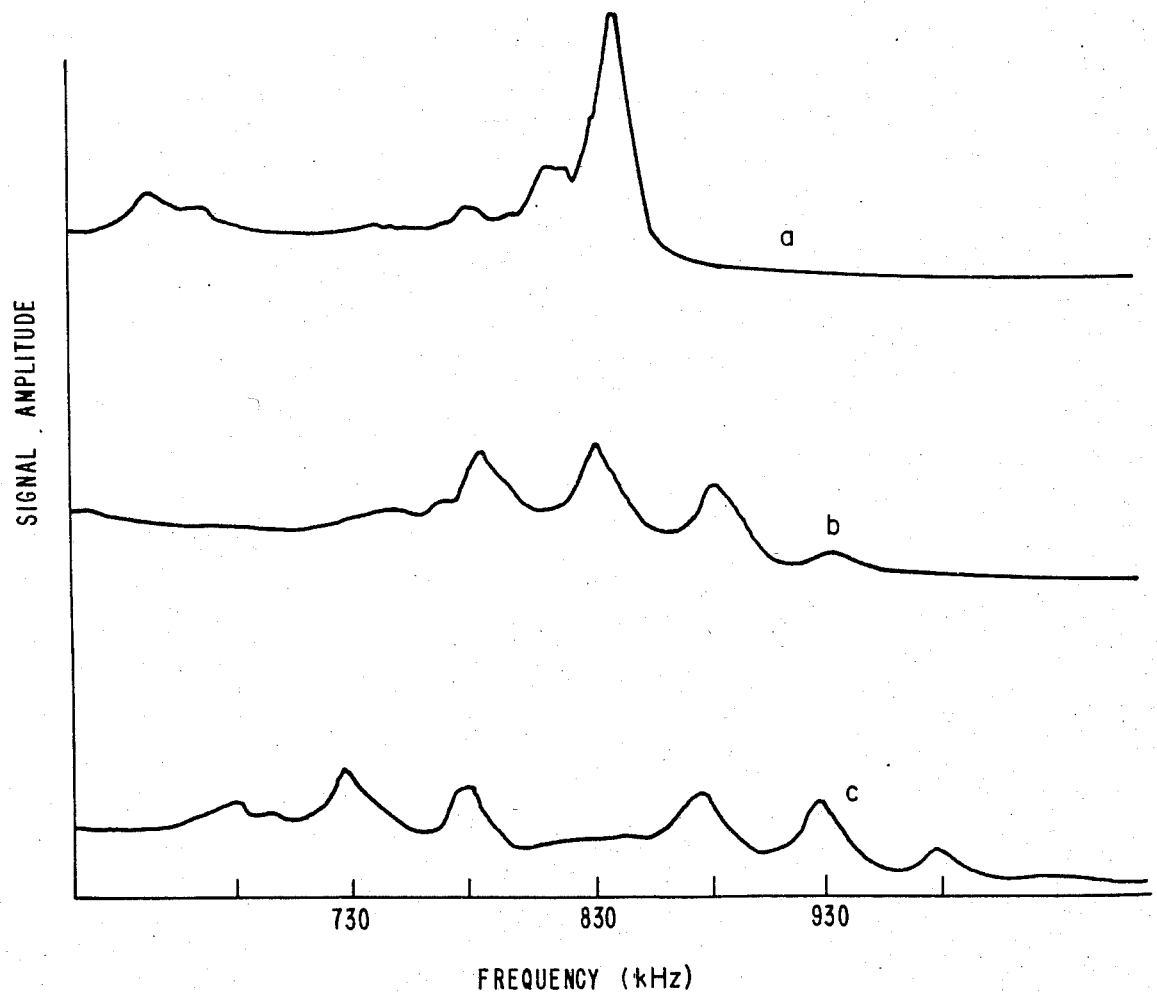
FIG. 2 shows the frequency spectrum of the coherent oscillations according to the present invention. graph 1(a) shows the fundamental with no modulation; graphs (b) and (c) show two values of the modulation amplitude; the modulation frequency is 50 kHz.

In FIG. 1, variable d.c. voltage 4 and a.c. signal voltage 6 are applied to the crystal 2. The resulting frequency modulated signal, $V_{out}$, is then obtained from the material 2. In this example, TaS$_3$ is employed as a material that displays the CDW state. However, any material that displays the CDW state may be used. On superimposing an a.c. voltage at a frequency of 50 KHz, sidebands of the 830 KHz signal appeared which were multiples of 50 KHz to the high and low sides of the fundamental peak. As the amplitude of the a.c. is increased the magnitude and number of sidebands increase. Typical spectra for three values of the a.c. amplitude are shown in FIG. 2.

Figure 3:
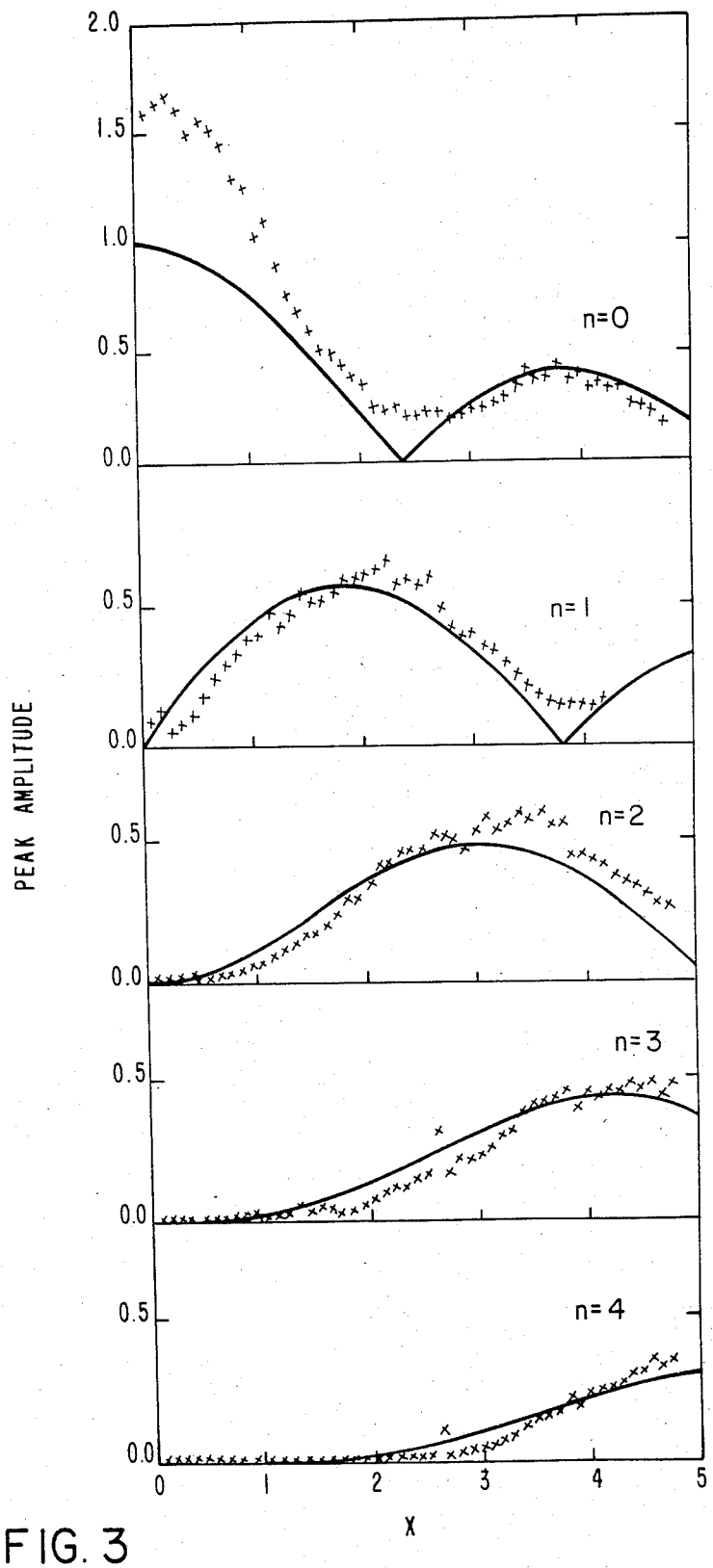
FIG. 3 shows the variation of the amplitude of the fundamental and side-bands (n=0,1,2,3,4) with the modulation amplitude. The solid lines are the theoretical values of $|J_n|$. The value of $X=\omega_F/\omega_M$ was evaluated experimentally from the I-V characteristics. The modulation frequency is 50 kHz.

In FIG. 3 the amplitude of peaks are compared with the theoretical values of the Bessel functions of equation 3. Except for the fundamental, where the background provided a systematic deviation at lower values of ($\omega_F/\omega_M$) the fit everywhere is excellent.

Figure 4:
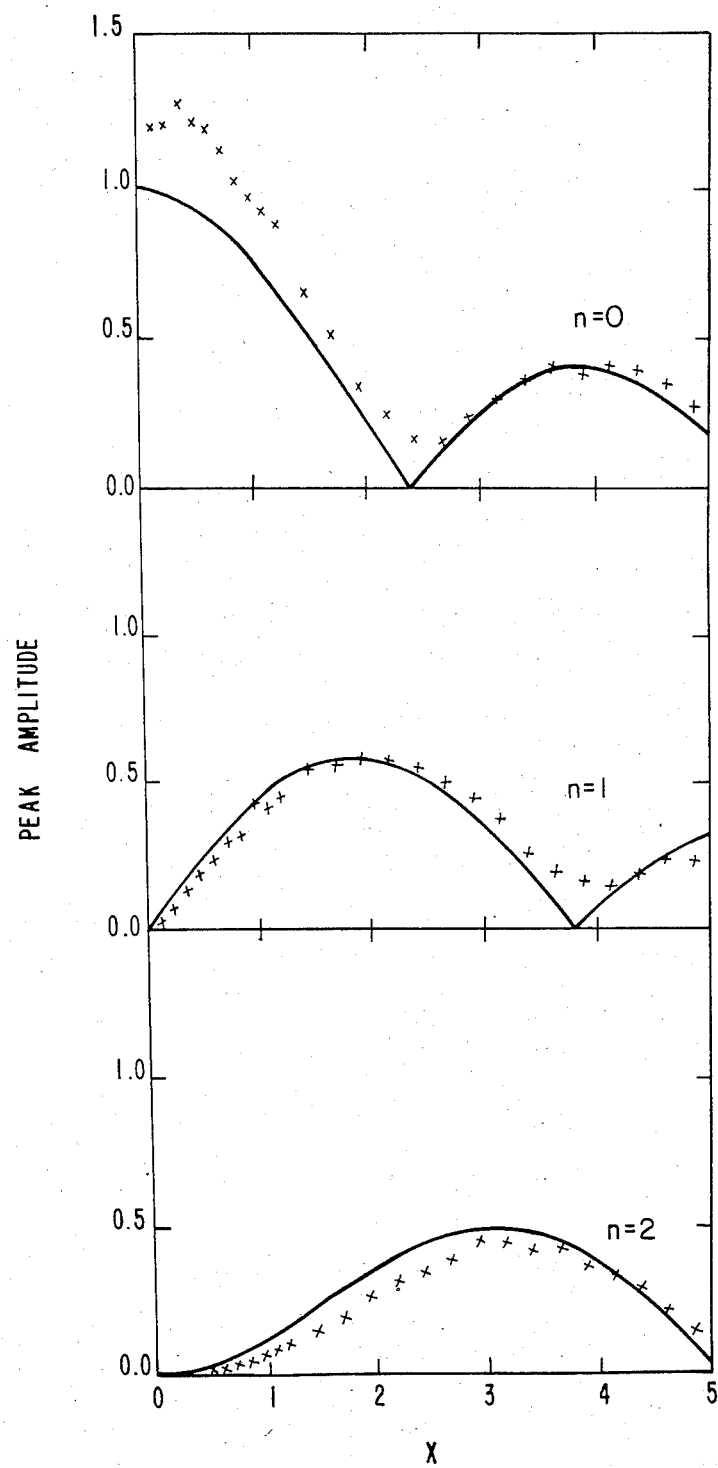
FIG. 4 shows the variation of the amplitude of the fundamental and the two side-bands (n=0,1,2 respectively). The modulation frequency is 100 kHz.

In order to complete the demonstration of the FM effect, the frequency $\omega_M$ of the modulating signal was varied. In FIG. 4 the modulation frequency was 100 KHz. The fit up to the third sideband is again excellent, with the systematic background problem evident again for the fundamental.

This example shows the performance of the material orthorhombic TaS$_3$ as a single crystal frequency modulator. It is noted that the same system in FIG. 1 will also act as a demodulator. In this case, a variable direct current voltage 4 is applied so that the ac frequency equals the carrier frequency of the signal to be demodulated. Then the signal to be demodulated 6 is applied in series with the dc voltage. The resulting frequency demodulated signal, $V_{out}$, is then obtained from the material, 2 whose amplitude and frequency spectrum varies in a predetermined way that depends on the amplitude of the carrier signal generated by the direct current voltage applied to the system. Since the basis of the operation of the system is caused by the presence of a sliding charge-density wave, all materials which have such a state will also act as frequency modulators, or demodulators.

The advantages of this device are as follows: (1) It is a single-component frequency modulator capable of replacing a complex many-component device. (2) It is a low impedance (but low power) device. (3) The carrier frequency can be tuned over a very wide range (1 KHz to 1 GHz).

What is claimed is:
1. A method for frequency demodulating a signal comprising:
    (a) imposing a direct current voltage across a material which displays sliding of a charge density wave such that said voltage induces a current in the material having direct current and alternating current components wherein said alternating current has a frequency $\omega_o$ which depends on the direct current component, said frequency $\omega_o$ being the same as the carrier frequency of the signal to be demodulated;
    (b) applying the signal voltage to be demodulated across said material in series with said direct current voltage; and
    (c) obtaining a frequency demodulated signal from said material.
2. The method of claim 1 wherein said frequency of said alternating current is proportional to said direct current component.
3. A device for frequency demodulation of a signal comprising:
    (a) a material carrying a sliding charge density wave,
    (b) a direct current voltage source applied to said material,
    (c) a signal source applied in series with said direct current voltage source,
    (d) means for obtaining an output signal out of said material, said output signal being a frequency demodulated signal.
4. The device of claim 3 wherein said material is selected from the group consisting of NbSe$_3$, TaS$_3$, NbS$_3$, K$_{0.3}$MoO$_3$, (TaSe$_4$)$_2$I and (NbSe$_4$)$_{10}$I$_3$.
5. The device of claim 4 wherein said material is TaS$_3$.

* * * * *